United States Patent
Venkatasubramanian

(10) Patent No.: US 7,282,798 B2
(45) Date of Patent: Oct. 16, 2007

(54) SPONTANEOUS EMISSION ENHANCED HEAT TRANSPORT METHOD AND STRUCTURES FOR COOLING, SENSING, AND POWER GENERATION

(75) Inventor: Rama Venkatasubramanian, Cary, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 243 days.

(21) Appl. No.: 10/169,721

(22) PCT Filed: Nov. 29, 2001

(86) PCT No.: PCT/US01/44517

§ 371 (c)(1),
(2), (4) Date: Aug. 29, 2002

(87) PCT Pub. No.: WO02/45150

PCT Pub. Date: Jun. 6, 2002

(65) Prior Publication Data

US 2003/0100137 A1    May 29, 2003

Related U.S. Application Data

(60) Provisional application No. 60/253,743, filed on Nov. 29, 2000.

(51) Int. Cl.
*H01L 35/00* (2006.01)
*H01L 33/00* (2006.01)

(52) U.S. Cl. .......... 257/713; 257/930; 257/21; 257/13; 257/98; 257/E23.112; 257/E23.082; 257/E33.075

(58) Field of Classification Search .......... 257/713, 257/930, 21, 13
See application file for complete search history.

(56) References Cited

U.S. PATENT DOCUMENTS

| 5,601,661 | A |   | 2/1997  | Milstein et al.              |
|-----------|---|---|---------|------------------------------|
| 5,812,716 | A | * | 9/1998  | Ohishi ................. 385/92 |
| 5,865,906 | A | * | 2/1999  | Ferguson et al. ....... 136/253 |
| 6,064,511 | A | * | 5/2000  | Fortmann et al. ....... 359/321 |
| 6,071,351 | A |   | 6/2000  | Venkatasubramanian           |
| 6,262,830 | B1|   | 7/2001  | Scalora                      |
| 6,300,150 | B1|   | 10/2001 | Venkatasubramanian           |
| 6,534,798 | B1| * | 3/2003  | Scherer et al. ........... 257/98 |
| 6,711,200 | B1| * | 3/2004  | Scherer et al. ........... 372/64 |

(Continued)

OTHER PUBLICATIONS

H.O. Everitt, "Applications of Photonic Band Gap Structures", Optics and Photonics News, vol. 3, No. 11, Nov. 1992, pp. 20-23.

(Continued)

*Primary Examiner*—Jerome Jackson
(74) *Attorney, Agent, or Firm*—Oblon, Spivak, McClelland, Maier & Neustadt, P.C.

(57) ABSTRACT

A method and structure for heat transport, cooling, sensing and power generation is described. A photonic bandgap structure (3) is employed to enhance emissive heat transport from heat sources such as integrated circuits (2) to heat spreaders (4). The photonic bandgap structure (3) is also employed to convert heat to electric power by enhanced emission absorption and to cool and sense radiation, such as infra-red radiation. These concepts may be applied to both heat loss and heat absorption, and may be applied to heat transport and absorption enhancement in a single device.

90 Claims, 8 Drawing Sheets

U.S. PATENT DOCUMENTS

2001/0052234 A1    12/2001    Venkatasubramanian
2002/0013042 A1    1/2002    Morkoc

OTHER PUBLICATIONS

Oct. 9, 2001, RTI International,"New Thermoelectric materials Can Keep Chips Cool Advances in Fiber Optics and in Biotechnology also are Likely".

RTI International Annual Report 2001, Turning Knowledge into Practice, pp. 4-37.

Thin-Film Thermoelectric Devices with High Room-Temperature Figures of Merit, Rama Venkatasubramanian et al., Research Triangle Institute, Research Triangle Park, North Carolina 27709, USA, 2001 Macmillan Magazines Ltd., Nature, vol. 413, Oct. 11, 2001, www.nature.com pp. 597-602.

In-situ Monitoring of the Growth of $Bi_2Te_3$ and $Sb_2Te_3$ Films and $Bi_2Te_3$-$Sb_2Te_3$ Superlattice Using Spectroscopic Eillipsometry Hao Cui et al. Journal of Electronic Materials, vol. 30, No. 11 2001, Special Issue Paper, pp. 1376-1381.

Thermal Characterization of $Bi_2Te_3$/$Sb_2Te_3$ Superlattices, M.N. Touzelbaev and P. Zhou, Department of Mechanical Engineering, Stanford University, Stanford, California 94305-3030, Rama Venkatasubramanian, Center for Semiconductor Research, Research Triangle Institute, Research Triangle Park, Durham, NC 27709-2195, K.E. Goodson [a], Electronic mail: goodson@vk.standord.edu, Journal of Applied Physics, vol. 90, No. 2, Jul. 15, 2001, pp. 763-767.

Smaller, Faster, Efficient Thermoelectric Cooling, Rama Venkatasubramanian, Technical Insights vol. 30, No. 41, Oct. 17, 2001 ISSN: 0300-757X, pp. 1-2.

CVD Diamond for Components and Emitters, J. Davidson et al., Diamond and Related Materials 10 (2001) pp. 1736-1742.

Sneak Preview, Optical Device Transfers Data Fast, Rama Venkatasubramanian, Design news Dec. 17, 2001, p. 14.

Lattice Thermal Conductivity Reduction and Phonon Localization-like Behavior in Superlattice Structures, Rama Venkatasubramanian, Research Triangle Institute, Research Triangle Park, North Carolinia 27709, Physical Review B, vol. 61, No. 4, Jan. 15, 2000-ll, pp. 3091-3097.

Phonon-Blocking Electron-Transmitting Structures, Rama Venkatasubramanian et al., Research Triangle Institute, Research Triangle Park, NC, USA, 18 International Conference on Thermoelectric (1999), pp. 100-103.

Magnetoresistance Technique for Determining Cross-Plane Mobility in Superlattice Devices, S.W. Johnson et al., National Renewable Energy Laboratory, Golden, CO, USA, Research Triangle Institute, Research Triangle Park, NC, USA, 18th International Conference on Thermoelectrics (1999), pp. 675-686.

RTI Research Yields Major Advance in Thermoelectrics, Rama Venkatasubramanian et al., pp. 8-9.

Cooling Film Tempers Tiny Hot Spots, Rama Venkatasubramanian et al., Science News, No. 3, 2001, v160, i18, p. 280.

Phonon Blocking Electron Transmitting Superlattice Structures as Advanced Thin Film Thermoelectric Materials, Rama Venkatasubramanian, Research Triangle Institute, Research Triangle Park, N.C., Chapter 4, Semiconductors and Semimetals, vol., pp. 175-201.

Improved Photoluminescence of GaAs in ZnSe/GaAs Heterojunctions grown by Organometallic Epitaxy, S.K. Ghandhi, et al., Electrical Computer, and Systems Engineering Department, Rensselaer Polytechnic Institute, Troy, New York 12180, Appl. Phys. Lett., vol. 53 No. 14, Oct. 3, 1988, pp. 1308-1310.

Epitaxy of Germanium using Germane in the Presence of Tetramethylgermanium, Rama Venkatasubramanian et al., Research Triangle Institute, P.O. Box 12194, Research Triangle Park, North Carolina 27709, J. Appl. Phys., vol. 66, No. 11, Dec. 1, 1989, pp. 5662-5664.

Incorporation Processes in MBE Growth of ZnSe, Rama Venkatasubramanian et al., Journal of Crystal Growth 95 (1989) pp. 533-537.

Radiative Recombination in Surface-free $n^+In^-In^+$ GaAs Homostructures, L.M. Smith and D.J. Wolford et al., Appl. Phys. Lett., vol. 57, No. 15, Oct. 8, 1990, pp. 1572-1574.

Measurement of AlGaAs/AlGaAs interface Recombination Velocities Using Time-Resolved Photoluminescence, M.L. Timmons, et al., Appl. Phys. Lett., vol. 56, No. 19, May 7, 1990, pp. 1850-1852.

Development of Low-Bandgap Ge and $Si_{0.07}Ge_{0.93}$ Solar Cells For Monolithic and Mechanically-Stacked Cascade Applications, Rama Venkatasubramanian et al. 1990 IEEE, pp. 73-78.

Graded-Band-GAP AlGaAs Solar Cells For AlGaAs/Ge Cascade Cells, M.L. Timmons, et al. 1990 IEEE, pp. 68-72.

Photoexcited Carrier Lifetimes and Spatial Transport in Surface-free GaAs Homostructures, L.M. Smith et al., J. Vac. Sci. Technol. B, vol. 8, No. 4 Jul./Aug. 1990, pp. 787-792.

Ideal Electronic Properties of a p-Ge/p-$Al_{0.85}Ga_{0.15}$As Interface, Rama Venkatasubramanian et al., Appl. Phys. Lett., vol. 59, No. 3, Jul. 15, 1991, pp. 319-320.

Selective Plasma Etching of Ge Substrates for Thin Freestanding GaAs-AlGaAs Heterostructures, Rama Venkatasubramanian et al., Appl. Phys. Lett., vol. 59, No. 17, Oct. 21, 1991, pp. 2153-2155.

Visible Light Emission From Quantized Planar Ge Structures, Rama Venkatasubramanian et al., Appl. Phys. Lett., vol. 59, No. 13, Sep. 23, 1991, pp. 1604-1605.

GaInAsP Lattice Matched to GaAs for Solar Cell Applications, P.R. Sharps, et al., Research Triangle Institute, P.O. Box 12194, RPT, NC 27709 1991 IEEE, pp. 315-317.

High-Temperature Performance and Radiation Resistance of High-Efficiency Ge and $Si_{0.07}Ge_{0.93}$ Solar Cells on Lightweight Ge Substrate, Rama Venkatasubramanian et al., pp. 85-98.

An Inverted-Growth Approach To Development Of An Ir-Transparent, high-Efficiency AiGaAs/GaAs Cascade Solar Cell, Rama Venkatasubramanian, M.L. Timmons, T.S. Colpitts, J.S. Hills, and J.A. Hutchby, Research Triangle Institute, Research Triangle Park, NC 27709, 1991 IEEE pp. 93-98.

International Electron Devices Meeting, 1991, Physical Basis and Characteristics of Light Emission From Quantized Planar Ge Structures, Rama Venkatasubramanian, et al., 1991 IEEE pp. 15.4.1-15.4.4.

High Quality GaAs on Si using $Si_{0.04}Ge_{0.95}$/Ge Buffer Layers, Rama Venkatasubramanian et al., Journal of Crystal Growth 107 (1991) pp. 489-493.

Optimization of the Heteroepitaxy of Ge on GaAs for Minority-Carrier Lifetime, Rama Venkatasubramanian, et al., Journal of Crystal Growth 112 (1991) pp. 7-13, Received Aug. 9, 1990; manuscript received in final form Dec. 14, 1990.

Intrinsic Recombination and Interface Characterization in "surface-free" GaAs Structures, D.J. Wolford et al., J. Vac. Sci. Technol. B, vol. 9, No. 4, Jul./Aug. 1991, pp. 2369-2376.

Advances in the Development of an AlGaAs/GaAs Cascade Solar Cell Using a Patterned Germanium Tunnel Interconnect, Rama Venkatasubramanian et al., Solar Cells, 30 (1991) pp. 345-354.

High-Quality Eutectic-Metal-Bonden AlGaAs-GaAs Thin Films on Si Substrates, Rama Venkatasubramanial et al., Appl. Phys. Lett., vol. 60, No. 7, Feb. 17, 1992, pp. 886-888.

Photoluminescence of Porous Silicon-Buried Underneath Epitaxial GaP, J.C. Campbell, et al., Appl. Phys. Lett., vol. 60, No. 7, Feb. 17, 1992, pp. 889-891.

Interface-Free GaAs Structures—From Bulk to the Quantum Limit, D.J. Wolford, et al., Inst. Phys. Conf. Ser. No. 120: Chapter 9, pp. 401-406.

Properties and Use of Cycled Grown OMVPE GaAs:Zn, GaAs:Se, and GaAs:Si Layers for High-Conductance GaAs Tunnel Junctions, Rama Venkatasubramanian et al., National Renewable Energy Laboratory, Golden, CO 80401, Journal of Electronic Materials, vol. 21, No. 9, 1992, pp. 893-899.

15.8%-Efficient (1-SUN, AM 1.5G) GaAs Solar Cell on Optical-Grade Polycrystalline Ge Substrate, Rama Venkatasubramanian et al., pp. 691-695.

Development of 20% Efficient GaInAsP Solar Cells, P.R. Sharps, et al., 1993 IEEE pp. 633-638.

Development of High-Efficiency $Al_{0.2}Ga_{0.8}As$ Solar Cells and Interconnect Schemes For $Al_{0.2}Ga_{0.3}As/Si$ Mechanically-Stacked Cascade Cells, Rama Venkatasubramanian, et al., 1993 IEEE pp. 752-756.

Photoreflectance Characterization of InP and GaAs Solar Cells, R.G. Rodrigues et al., 1993 IEEE pp. 681-685.

Close-Packed Cell Arrays for Dish Concentrators, J.B. Lasich et al., Solar Research Corporation Pty. Ltd., 6 Luton Lane, Hawthorn, Victoria 3122, Australia and M. Timmons et al., Research Triangle Institute, RTP, USA, 1994 IEEE pp. 1938-1941.

GaAs and $Al_{0.2}Ga_{0.6}As$ Solar Cells With An Indirect-Bandgap $Al_{0.a}Ga_{0.2}As$ Emitter—Heterojunction Cells, Rama Venkatasubramanian et al., Research Triangle Institite, RTP, NC 27709, H. Field and K. Emery, National Renewable Energy laboratory (NREL), Golden, CO 80401, First WCPEC; Dec. 5-9, 1994; Hawaii, pp. 1839-1842.

The Growth and Radiation Response of $N^+p$ Deep Homojunction InP solar Cells, M.J. Panunto et al., M.L. Timmons, et al., First WCPEC; Dec. 5-9, 1994; Hawaii, pp. 2192-2195.

Material and Device Characterization Toward high-Efficienty GaAs Solar Cells on Optical-Grade Polycrystalline Ge Substrates, Rama Venkatasubramanian, et al, R. Ahrenkiel, et al., First WCPEC: Dec. 5-9, 1994; Hawaii, 1994 IEEE pp. 1692-1696.

Silicon and GAAS/GE Concentrator Power Plants: A Comparison of Cost of Energy Produced, R.A. Whisnant et al., First WCPEC; Dec. 5-9, 1994; Hawaii, 1994 IEEE pp. 1103-1106.

Compensation Mechanisms in $N^+$-GaAs Doped With Silicon, Rama Venkatasubramanian, et al., Electrical Computer, and Systems Engineering Department, Rensselaer Polytechnic Institute, Troy, New York 12180, USA, Journal of Crystal Growth 94 (1989) pp. 34-40.

High-Efficiency Tandem Solar Cells on Single- and Poly-Crystalline Substrates, J.A. Hutchby et al., Center for Semiconductor Research, Research Triangle Institute, Research Triangle Park, NC 27709, USA, Solar Energy Materials and Solar Cells 35 (1994) pp. 9-24.

Optoelectronic Properties of Eutectic-Metal-Bonded (EMB) GaAs-AlGaAs Structures on Si Substrates, Rama Venkatasubramanian, et al.,Solid-State Electronics, vol. 37, No. 11, pp. 1809-1815, 1994.

Heteroepitaxy and Characterization of Ge-rich SiGa Alloys on GaAs, Rama Venkatasubramanian et al., J. Appl. Phys., vol. 69, No. 12, Jun. 15, 1991, pp. 8164-8167.

18.2% (AM1.5) Efficient GaAs Solar Cell on Optical-Grade Polycrystalline Ge Substrate, Rama Venkatasubramanian et al., 25th PVSC; May 13-17, 1996: Washington, D.C. 1996 IEEE pp. 31-36.

Experimental Evidence of High Power Factors and Low Thermal Conductivity in $Bi_2Te_3/SB_2Te_3$ Superlattice Thin-Films, Rama Venkatasubramanian et al., Research Triangle Institute, Research Triangle Park, NC 27709, USA, 15th International Conference on Thermoelectrics 91996), 1996 IEEE pp. 454-458.

Thermal Conductivity of Si-Ge Superlattices, S.-M. Lee and David G. Cahill[2)], Rama Venkatasubramanian, Appl. Phys. Lett. vol. 70, No. 22, Jun 2, 1997, pp. 2957-2959.

20% (AM1.5) Efficiency GaAs Solar Cells on Sub-mm Grain-Size Poly-Ge And Its Transition to Low-Cost Substrates, Rama Venkatasubramanian et al., 26th PVSC; Sep. 30-Oct. 3, 1997; anaheim, CA 1997 IEEE, pp. 811-814.

Electronic and Mechanical Properties of Ge Films Grown on Glass Substrates, R.K. Ahrenkiel et al., 26th PVSC; Sep. 30-Oct. 3, 1997; Anaheim, CA, pp. 527-529.

MOCVD of $Bi_2Te_3$ and Their superlattice structures for Thin-Film Thermoelectric Applications, Rama Venkatasubramanian et al., Journal of Crystal Growth 170 (1997), pp. 817-821.

A Silent Cool: Thermoelectrics May Offer New Ways to Refrigerate and Generate Power, Corinna Wu, Science News, Sep. 6, 1997 v152 n10 p152(2), pp. 1-3.

ONR Contributes to Thermoelectric Research (Office of Naval Research) (Bried Article), Ozone Depletion Network Online Today, Contact ONR, website http://www.onr.navy.mil., Nov. 2001.

In-Plane Thermoelectric Properties of Freestanding Si/Ge Superlattice Structures, Rama Venkatasubramanian et al., 17th International Conference on Thermoelectrics 91998), pp. 191-197.

Potential of Si-based Superlattice Thermoelectric Materials for Integration with Si Microelectronics, Rama Venkatasubramanian et al., 1998 IEEE, p. 869.

Low-temperature Organometallic Epitaxy and Its Application to Superlattice Structures in Thermoelectrics, Rama Venkatasubramanian, [a)], et al., Sandra Liu and Nadia El-Masry, Michael Lamvik, Applied Physics Letters, vol. 75, No. 8, Aug. 23, 1999, pp. 1104-1106.

Optical Constants of $Bi_2Te_3$ and $Sb_2Te_3$ Measured using Spectroscopic Ellipsometry, HAO CUI, [1] I.B. BHAT, [1,3] and Rama Venkatasubramanian[2], 1.-Electrical, Computer and Systems Engineering Department, Rensselaer Polytechnic Institute, Troy, NY 12180-3590, USA. 2.-Research Triangle Institute, Research Triangle Park NC 27709, USA, 3.-e-mail:bhati@.rpi.edu., Journal of Electronics Materials, vol. 28, No. 10, 1999, pp. 1111-1114.

Thin-Film Technology, Research Triangle Institute, Investment Opportunities, in Thermoelectronics, Jun. 6, 2001, website http://www.rti.org/units/es.cfm, pp. 1-2.

Nature Publishing Group, Materials Update, Cool Future for Semiconductors, Oct. 11, 2001, pp. 1-3.

Cool New Film, Science Update, oct. 11, 2001, http://www.nature.com/nsu/011011/011011-12,html, pp. 1-2.

Semiconductors are Cool, News and Views, Cronin B. Vining, 2001 Macmillan Magazines Ltd., Nature, vol. 413, Oct. 11, 2001, www.nature.com, pp. 577-578.

Thermoelectric Boost, Richard Babyak, Appliance Manufacturer, Design and Engineering Solutions for the Global Appliance Industry, http://www.ammagazine.com/CDA/ArticleInformation/features/BNP_Features_Item/0.260 . . . Jul. 18, 2002, pp. 1-2.

Thermoelectrics from Hot to Cool, New Technology Offers Efficient way to Heat or Cool ICS in Operation, Jeff Dorsch, Semiconductor Magazine, http://www.semi.org/web/wmagazine.nsf/4f55b97743c2d02e882565bf006c2459/27e74866ea . . . , Jun. 20, 2002, pp. 1-3.

Patent Abstracts of Japan, JP 2000-267585, Sep. 29, 2000.

MAB, Harvesting Human Energy, Nov. 29, 2001, pp. 1-3.

Wayne Lee, Seiko Thermic, The World's First Watch That Driven By Body heat, Mar. 29, 2003, pp. 1-5.

Shawn-Yu Lin, et al. "Enhancement and Suppression of Thermal Emission by a Three-Dimensional Photonic Crystal", The American Physical Society, XP-002408634, vol. 62, No. 4, Jul. 15, 2000, pp. R2243-R2246.

Shawn-Yu Lin, et al. "Photonic Band-Gap Microactivities in Three Dimensions", Yhe American Physical Society, XP-002408635, vol. 59, No. 24, Jun. 15, 1999, pp. R15579-R15582.

James T. Daly, et al. "Tuned Infrared Emission From Lithographically-Defined Silicon Surface Structures", Materials Research Society, XP-009055563, vol. 607, 2000, pp. 175-180.

* cited by examiner

SPONTANEOUS EMISSION ENHANCED HEAT TRANSPORT METHOD AND STRUCTURES FOR COOLING, SENSING, AND POWER GENERATION

BACKGROUND OF THE INVENTION

1. Field of the Invention

The present invention relates to a method and a structure for heat transport, and more particulary to a method and a structure for spontaneous emission enhanced heat transport for cooling, sensing and power generation. The present invention also relates to methods and structures for cooling, sensing and power generation.

2. Discussion of the Background

For a long time the spontaneous emission of light was considered a natural and immutable property of radiating atoms. However, Purcell showed that an atom in cavity would radiate faster than an atom in free space (E. M. Purcell, Physical Review, 69, 681 (1946)). Purcell indicated that the spontaneous emission at wavelength $\lambda$ will be increased by a factor f given by, $f \sim (\lambda^3/a^3)$, where a is the dimension of the cavity. For example, Purcell suggested that incorporating metal particles of $10^{-3}$ cm diameter in a matrix can cause the spontaneous emission rate at radio frequencies, $10^7$ Hz ($\lambda \sim 3 \times 10^3$ cm), to increase by a whopping $f \sim \lambda^3/a^3 = (3 \times 10^3)^3/(10^{-3})^3 \sim 2.7 \times 10^{19}$ times. Thus the thermal equilibration time constant at radio frequencies will come down from $5 \times 10^{21}$ sec to only 3 minutes.

From Planck's radiation law, the spontaneous emission at frequency $\nu$ is derived from a probability $A_\nu$, given by $$A_\nu \sim [8\pi h \nu^3/c^3] \quad (1)$$

The above coefficient $A_\nu$ gets modified by the Purcell factor, f, indicated above, Now, consider spontaneous emission at or near room temperature. Wein's Law gives the peak emission wavelength ($\lambda_T$) at a temperature T:

$$\lambda_T = \frac{2.89 \times 10^{-3} \, Km}{T \, (\text{in K.})}$$

For the purpose of this discussion, consider the radiative emission at this peak wavelength. The following equation is obtained:

$$\lambda_{300K} \sim 9.67 \, \mu m \text{ or } \nu_{300K} \sim 3.1 \times 10^{13} \, Hz.$$

Compared to spontaneous emission at radio frequencies ($\nu \sim 10^7$ Hz discussed above), the probability of the spontaneous emission (at 300K) at far-infrared wavelengths ($\nu \sim 3.1 \times 10^{13}$ Hz) is already high from eqn. (1). It is for this reason, all bodies are observed to radiate significant amount of radiation at 300K. This is the basis for imaging using IR wavelengths.

Even though the above spontaneous emission at IR wavelengths is significantly useful for IR imaging purposes, the energy loss (dissipative transfer) from spontaneous emission of a body even at a slightly higher temperature than 300K is rather small. The energy flux ($\Phi$) radiating from a blackbody at temperature (T) including all frequencies is given by the Stefan Boltzmann Law:

where $\varepsilon$ = emissivity, and $\sigma$ = Stefan Boltzmann constant = $5.672 \times 10^{-5}$ erg/sec $1/cm^2 deg^4$ $= 5.672 \times 10^{-12}$ $W/cm^2$ $1/deg^4$ For a blackbody with $\epsilon=1$ at T=300K, the following is obtained:

$$\Phi \approx 4.39 \times 10^{-2} \, W/cm^2 \quad (2)$$

From a heat-spreader point of view, as used in many electronics and other sensitive cooling applications around 300K, this $\Phi$ is small. Hence most of the heat that is removed from the electronics (like a modern day 1.2 GHz Pentium® processor) is achieved through a convective process (blowing air across fins) or through other conductive/heat-transfer process (flowing liquid) as in many top-of-the-line servers and main-frame computer electronics. These heat transfer processes are at best modest just enough that the Pentium® chip does not overheat or that the reliability of the servers are not in doubt. However such solutions are insufficient for many future cooling applications in computer electronics operating in the 2 GHz range and above. This will be especially true if high-performance thin-film thermoelectrics are used to actively pump the heat from the chip, when the power density levels that need to be dissipated (taking into account some heat-spreading effects from the source to the spreader-sink side) can easily be in the range of several to tens of watts/$cm^2$. See L. H. Dubois, Proc. of $18^{th}$ International Conference on Thermoelectrics, 1, (1999), IEEE Press. Catalog No. 99 TH8407 and references cited in this article.

For spot-cooling of high-power electronics and high-power VCSELS, simple convective cooling processes are insufficient. Also, the above methods of cooling with blowing air or flowing liquid are cumbersome and introduce unwanted complexities to systems.

SUMMARY OF THE INVENTION

It is an object of the invention to provide a method for and a structure having enhanced heat transfer.

It is also an object of the invention to provide a method for and a structure having enhanced heat transfer through spontaneous emission.

It is a further object of the invention to provide a method for and a structure having the ability to absorb the IR radiation efficiently thus leading to a better sensing device.

Still another object of the invention is to provide a method for and a structure having the ability to absorb the IR radiation efficiently thus leading to a better thermal-to-electrical power conversion device.

Yet another object of the invention is to provide hand-held computational and communication devices with power using a thermal-to-electrical power conversion device according to the invention.

These and other objects may be obtained using a heat transfer structure having a heat spreader, a photonic bandgap structure connected to the heat spreader, and a defect cavity formed in the photonic bandgap structure. A region in the heat spreader may be arranged to receive heat from a heat source, and the defect cavity may be positioned adjacent to the region. A thermoelectric device may also be connected to the heat spreader.

The photonic bandgap structure may comprise an array of columnar structures formed around the cavity. The columnar structures may have a diameter and a spacing based upon a wavelength of emitted radiation.

The photonic bandgap structure may also comprise a high thermal conductivity material with one of metal, semi-metal and semiconductor particles disposed in the material. The particles may have an infrared transmission property different from infrared transmission properties of the material. The particles may be separated in the material by one half to three times a wavelength of an infrared emission peak corresponding to the respective temperature of the structure.

The photonic bandgap structure may also comprise microfins enhancing both radiative and emissive heat transport.

The objects of the invention may also be obtained by a method of heat transport comprising removing heat from a heat source and using a photonic bandgap structure to allow radiative heat transport and enhancing emissive heat transport. The method may also include steps of disposing a defect cavity in the photonic bandgap structure, positioning the cavity to be aligned with heat transport from the heat source, disposing a plurality of defect cavities in the photonic bandgap structure, and positioning a plurality of cavities to be respectively aligned with heat transport from plurality of heat sources.

The device according to the invention can have the photonic bandgap structure connected to the heat spreader. The photonic bandgap structure may also be formed as part of a heat spreader. In the case of the heat source being an electronic integrated circuit, the photonic bandgap structure may also be formed as a part of the substrate of the integrated circuit or device.

The device according to the invention may also be a sensing device having an infrared sensor with a sensing surface and a photonic bandgap structure disposed to enhance coupling of infrared radiation to the sensing surface.

The device according to the invention may also be a thermal-electric conversion device comprising a heat absorption element, a heat-to-electric conversion device coupled to the element and a photonic bandgap structure disposed to enhance coupling of heat to said heat absorption device. In a further embodiment, the device according to the invention may comprise a sensing device having an infrared sensor and a first photonic bandgap structure, and an infrared enhancing emission structure disposed to enhance emission of infrared radiation to the sensor and comprising a second photonic bandgap structure.

In yet another embodiment, a device may comprise a thermal-electric conversion device having a heat absorption element, a heat-to-electric conversion device and a first photonic bandgap structure, and a heat absorption device and a heat enhancing emission structure disposed to enhance emission of heat to the element and comprising a second photonic bandgap structure.

The devices according to the invention may be sized to be hand-held, and the devices according to the invention may be adapted to supply converted power to a hand-held electronic device. The devices according may also be adapted to absorb heat from a waste heat source, such as the hand of a person.

Since good emitters are good absorbers, the concepts presented for increased spontaneous emission are equally applicable to structures designed increased absorption. Thus, these concepts are applicable to sensing of infrared radiation useful in infrared sensors as well as generation of electrical power based on absorbing heat radiation.

BRIEF DESCRIPTION OF THE DRAWINGS

FIG. 2A is a diagram of a photonic bandgap structure having a square cavity;

FIG. 2B is a diagram of a photonic bandgap structure having a hexagonal cavity;

DESCRIPTION OF THE PREFERRED EMBODIMENTS

According to the invention, enhanced radiative heat transfer of heat from a semiconductor chip, or other device or structure requiring cooling, is obtained. This may be accomplished by integrating a photonic bandgap structure with a heat spreader or on the device or structure requiring cooling. Spontaneous emission (at far-infrared wavelengths) is enhanced for increased radiative heat loss.

Figure 1A:
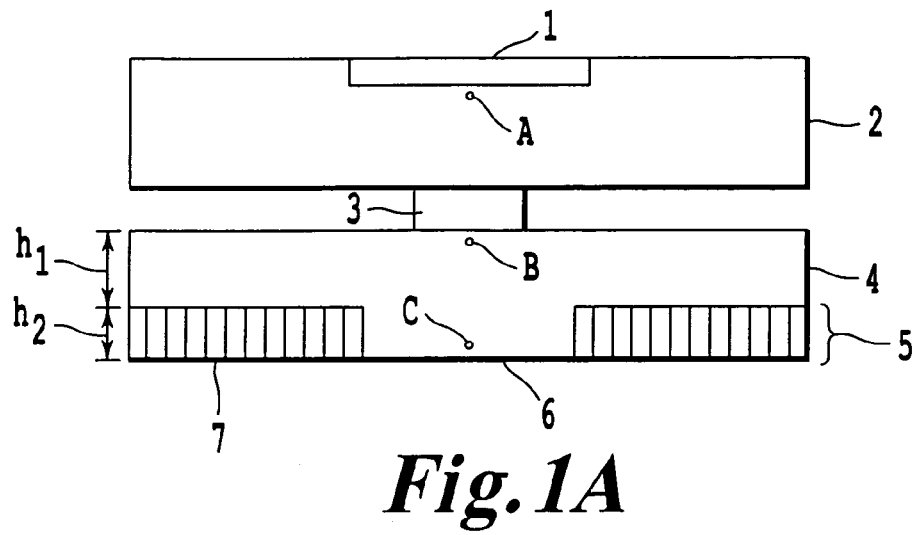
FIG. 1A is a diagram of a first embodiment of the device according to the invention.

A schematic diagram of a photonic bandgap structure according to a first embodiment integrated onto a heat spreader is shown in FIG. 1A. Here, an active thermoelectric (TE) device 3 pumps heat from the desired region, such as active region 1, of a semiconductor device 2. Device 3 may be a thin-film TE device that can pump heat at >100 W/cm$^2$ at point A. The heat that is pumped by the TE device 3 is dumped at heat spreader 4 at point B. Heat spreader 4 can be made of a number of materials having high thermal conductivity, such as diamond or SiC.

Heat spreader 4 is shown to have about the same dimensions of the device 2, and TE device 4 is shown to have similar dimensions to active region 1. This is merely for illustrative purposes and the invention is not so limited. For example, the active region may cover most of the surface of device 2, and the spreader may be of smaller or larger dimensions compared to device 2, depending upon the application, desired results or other factors.

The heat spreads from B to C, the location of the ultimate heat-sink. Going from points B to C, depending on the thermal conductivity and thickness of the spreader, the power density at C can be in the range of 5 to 10W/cm$^2$ for a thin-film TE device pumping at 100 W/cm². For a bulk TE device, with a cooling power density of only 5 to 10 W/cm², the power density at C would be in the 0.5 to 1 W/cm². Note that from eqn. (2)

$$\Phi \cong 4.39 \times 10^{-2} \; W/cm^2 << 5 \text{ to } 10 \; W/cm^2$$

obtained with the conventional heat spreaders, i.e., without the photonic bandgap/defect structure combination according to the invention.

Attached to or incorporated into spreader 4 is a photonic bandgap structure (PBS) 5. PBS 5 is preferably made of the same material as the heat spreader 4, but it not necessary. A PBS made of a different material could also be attached to the heat spreader in intimate thermal contact. A defect cavity 6 may be formed at the center of PBS 5. If such a PBS material is integrated with a defect cavity 6, as shown in FIGS. 2A and 2B, then cavity 6 will show enhanced radiative heat loss at λ≅10 μm. There will also be improvement at other wavelengths, for example λ≦10 μm. Note that the enhanced radiative property comes from the interaction between the PBS and the adjoining cavity, where the heat is to be dissipated. Thus defect cavity 6 of PBS 5 preferably coincides with the heat-spreading area directly below the active-heat generating area A as shown in FIG. 1. Such a structure is termed a Spontaneous Emission Enhanced Heat Transport (SEEHT), achieved here using photonic bandgap structures.

Figure 1B:
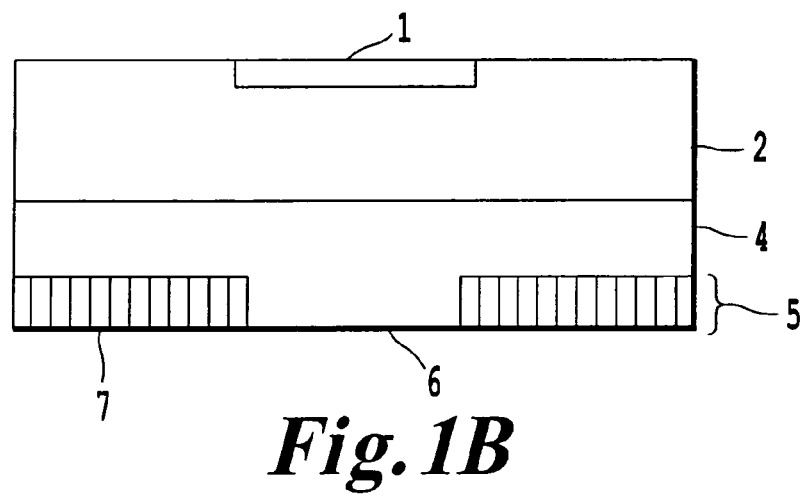
FIG. 1B is a diagram of a modification of the first embodiment of the device according to the invention.
Figure 1C:
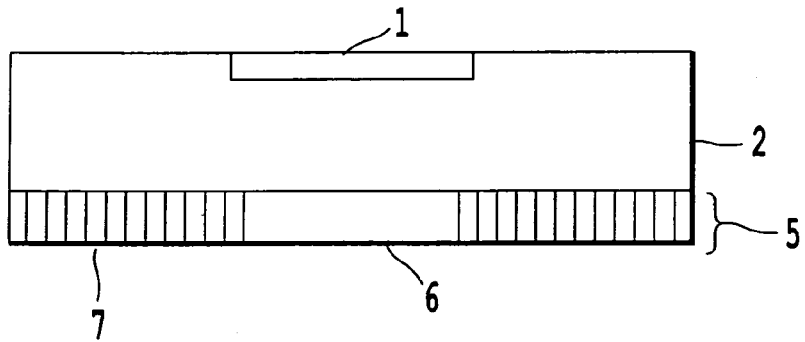
FIG. 1C is a diagram of another modification of the first embodiment of the device according to the invention.
Figure 1D:
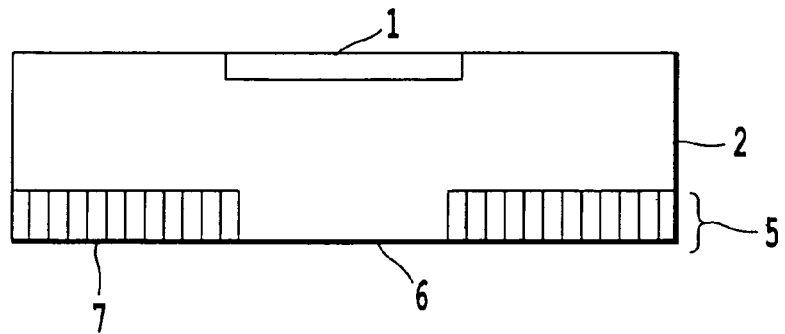
FIG. 1D is a diagram of another modification of the first embodiment of the device according to the invention.

FIG. 1B illustrates a modification of the embodiment of FIG. 1A where the TE device 3 is omitted and the heat spreader 4 with PBS 5 is attached directly to the device 2, at the backside. A further modification is shown in FIG. 1C where the separate heat spreader is omitted and the PBS 5 is attached directly to the device 2, at the backside. PBS 5 can be located at a position other than the backside. For example, PBS 5 and the associated defect cavity can be located above the active region. Lastly, FIG. 1D shows a modification where the PBS 5 is formed as part of the device 2.

Figure 1E:
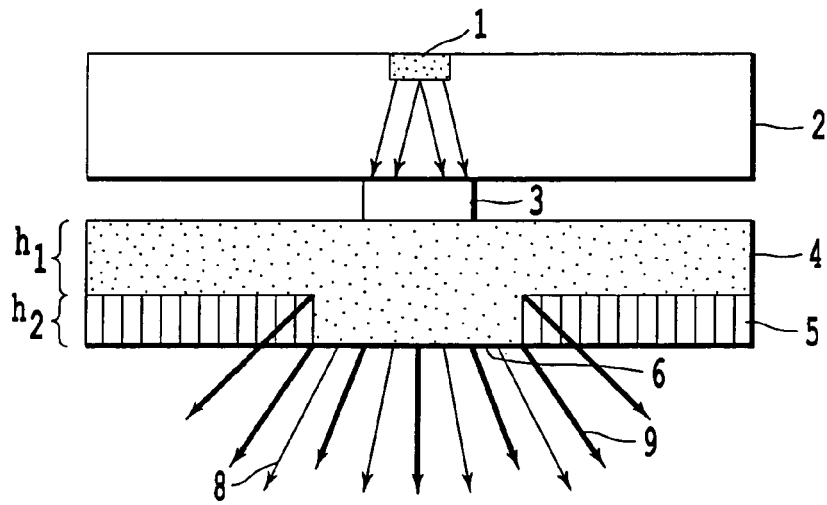
FIG. 1E is a diagram of the device of FIG. 1A illustrating regular heat dissipation and radiative heat emission.
Figure 1F:
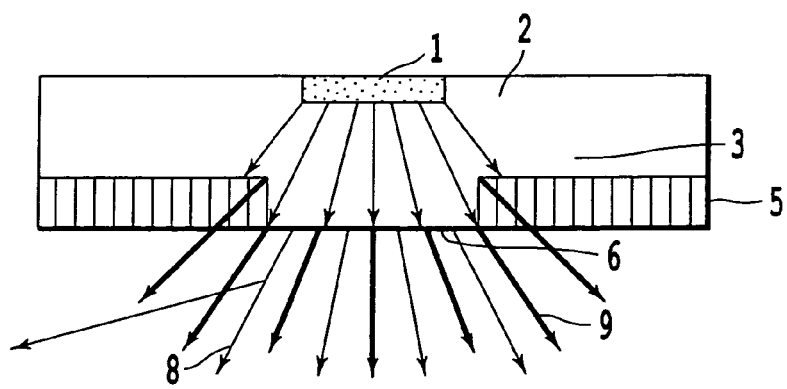
FIG. 1F is a diagram of the device of FIG. 1D illustrating regular heat dissipation and radiative heat emission.

More detailed views are shown in FIGS. 1E and 1F. In FIG. 1E, shown with the device of FIG. 1A is the enhanced heat dissipation 8, i.e. convective heat loss, and enhanced radiative heat emission 9. The dissipation 8 may also contain a component from the structures in PBS 5 acting as microfins (not shown). In FIG. 1E, the heat transfer efficiency by the radiative process is enhanced also due to the leakage of modes from the cavity area (where heat arrives from the chip by spreading) to the PBS area similar to enhanced photoluminescence efficiency in light emitting diodes. FIG. 1F shows the heat dissipation 8 and heat emission 9 in the structure of FIG. 1D.

Figure 2C:
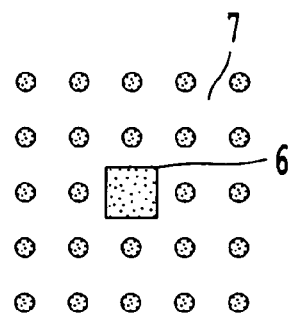
FIG. 2C is a diagram of a photonic bandgap structure having a circular cavity.
Figure 2C:
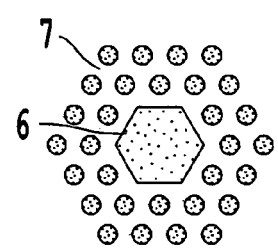
Figure 2C:
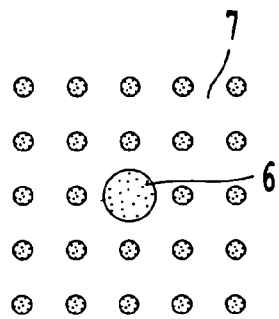

An example of PBS 5 according to the invention is shown in FIGS. 2A-2C. PBS 5 contains cavity 6 and photonic bandgap structures 7 consisting of columnar structures spaced in an array. Cavity 6 is square in FIG. 2A, hexagonal in FIG. 2B, and circular in FIG. 2C, but it is noted that other shapes are possible. The cavity interrupts the periodicity of the photonic bandgap structures 7. This dramatically increases the spontaneous emission and thus dramatically increases the heat dissipation.

Also, the size of cavity 6 may be varied, depending upon the application. The cavity usually should be larger than the individual PBS columnar structures to create interruption in the photonic bandgap structure. Close packing is a consideration. Also, the size can be optimized based upon the peak-producing area and the enhancement factor from the Purcell effect. The size may also be chosen in relation to the size of source of heat or the size of the heat transfer path.

The defect cavity 6 surrounded by the photonic bandgap structure shown in FIGS. 2A and 2B can provide at least a ten-fold enhancement in spontaneous emission intensity (i.e., radiative heat loss capability) where it is needed. Higher enhancement factors can be obtained with smaller cavity sizes, i.e., small areas where heat is generated. In other words, the cavities can be strategically placed to remove heat from one or many specific areas.

Figure 2D:
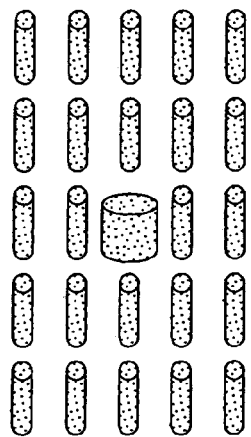
FIG. 2D is a perspective view of the diagram of a photonic bandgap structure having a cavity.

FIG. 2D is a perspective cross-sectional view of PBS 5 of FIG. 2A. Structures 6 and 7 may be formed by etching the material of PBS 5 using known etching techniques, such as those employed in semiconductor processing. For example, dry or wet etching using a masking material may be used to define structures 7. Structures 7 may be separately formed and integrated with a heat spreader.

Figure 3:
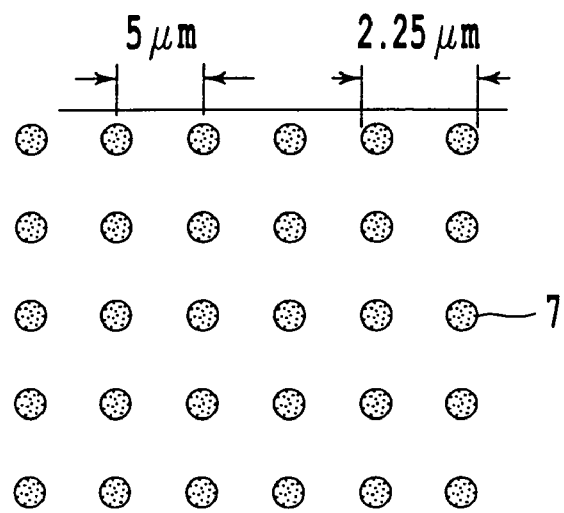
FIG. 3 is a diagram illustrating the size and spacing of the arrayed structures in a photonic bandgap structure.

In a more specific example illustrated in FIG. 3, for λ≅10 μm, corresponding to the peak wavelength at 300K, a, the lattice spacing for the photonic bandgap is $$a/\lambda \cong 0.5 \text{ or } a \cong 5 \mu m$$

and the radius r for a circular structure is $$r/a \cong 0.45 \text{ or } r \cong 2.25 \mu m$$

Thus in FIG. 3, with a=5 μm and r≅2.25 μm, a photonic bandgap structure with a pitch around 10 μm results. Note that although this design is for 10 μm and the radiative emission occurs over a broad range of wavelength around 10 μm, proportional improvement may be expected at other wavelengths as well.

Note that this design is for λ≅10 μm, corresponding to the peak wavelength at 300K. If heat sink or device operates at higher temperatures, such as 400K, then the expected peak λ~7.3 μm. For above example, a, the lattice spacing becomes ~3.7 μm, and r, the diameter of the structure would be ~1.7 μm. Such operating temperatures are likely to useful for high-temperature Si power electronics heat spreading applications and high-temperature/high-power SiC and GaN device applications.

If the PBS is to be designed for lower heat sink temperatures such as 77K, then the expected peak λ~38 μm. In the above example, a would be ~19 μm, and r would be ~8.6 μm. Obviously, such larger "a" and "r" should be easier and cheaper to achieve in practice. Such heat spreaders are likely to be useful for low-temperature applications as in low-temperature electronics, superconducting motors and generators.

Heat spreader 4 has dimensions $h_1$ and $h_2$ shown in FIGS. 1A and 1E. Typically, in a heat spreader, it is preferable to minimize $h_1$ to effectively dissipate the arriving heat at B. However, the physical handling of the heat spreader poses certain limitations on minimal thickness. In the heat spreader shown in FIGS. 1A and 1E, $h_1$ is preferably in the range of 25 μm to 300 μm. The dimension $h_2$ is likely to dominated by the consideration of the thickness of the desired structures that can be produced reliably. The ratio of thickness of $h_2$ relative to $h_1$ can be maximized, if necessary. The dimension $h_2$ could be in the range of about 1-10 μm for application at 300K.

In FIG. 1D, a further modification of the FIG. 1A structure is shown, where the bottom-side of the substrate (which contains the electronics) itself is patterned to achieve similar spontaneous-emission enhanced heat removal. Of course, this avoids the use of the heat spreader as well as the thermoelectric device. Such an arrangement is conceivable in Si-based electronics as Si, with its high thermal conductivity, can serve as the heat spreader as well as the spontaneous-emission enhanced emitter. Also, note the distinction between the heat waves and the light waves. Note again the distinction between the regular heat dissipation and the additional spontaneous emission enhanced light waves is indicated in FIG. 1D.

It is also conceivable that the spontaneous emission light waves could be absorbed by a black body absorber (not shown) that is maintained at a lower temperature by a mechanism such as thermoelectric cooling or liquid cooling.

Figure 4:
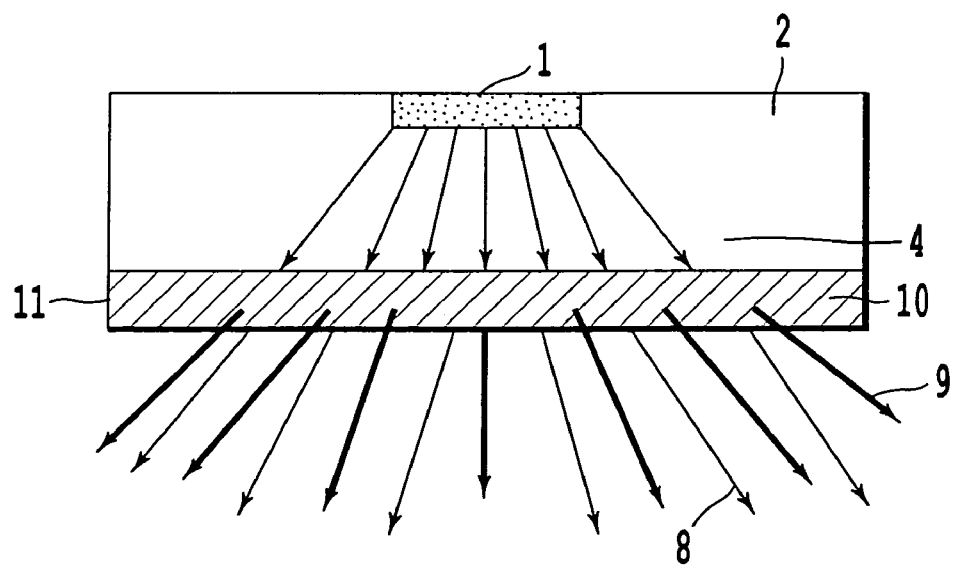
FIG. 4 is a diagram of a second embodiment of the device according to the invention.

A second embodiment of an enhanced spontaneous emission device according to the invention is shown in FIG. 4. Conductive particles 11 are incorporated into the heat spreader to produce an enhanced radiative heat emitter 10. As an example, approximately 2 μm particles (metal) are incorporated in a heat spreader like SiC, AlN or Si. The Purcell enhancement factor f, at ≅300K, for spontaneous radiative emission would be, for λ≅10 μm and a≅2 μm:

$$f \cong \lambda^3/a^3 \cong 125$$

Thus from eqn. (2) and the f of 125, we obtain for the structure of FIG. 4:

$$\Phi \cong 125 \times 4.39 \times 10^{-2} \ W/cm^2 \cong 5.5 \ W/cm^2$$

If 1.0 micron size particles are incorporated, then the radiative emission enhancement can be as much as a factor of 1000, over a conventional heat spreader, leading to a Φ of 44W/cm². If such micron size particles can be incorporated by impregnation or self-assembly-followed by overgrowth, then the scope for radiative heat loss mechanisms would be considerably enhanced.

The particles 11 can be made of metal, semiconductor, semimetal in a matrix of a high-thermal conductivity heat spreader such as SiC, AlN, Si, diamond, etc. The particles 11 are preferably chosen so that their infrared emission characteristics are different from that of the heat spreader so that the substrate matrix and the particle do not form a continuum from an electromagnetic emission standpoint. These emission characteristics in turn can be traced to their complex refractive indices at the wavelength of interest. It is expected that even a few percent difference in the refractive index between the particle and the substrate matrix may produce sufficient enhancement in spontaneous emission rates. A larger difference in the refractive index will also benefit the enhancement.

It is also preferable that the particles are separated from each other (in linear distance) by about one half to three times the wavelength of the IR emission peak corresponding to the respective temperature. For example at a temperature of 300K, with the emission peak at 10 microns, the spatial separation between adjacent 1 micron particle could be anywhere between 5 microns to 30 microns. The efficiency of the radiative emission process could depend on this spatial separation due to the coupling between the these particles forming a continuum. Regular heat dissipation 8 and the additional spontaneous emission enhanced light waves 9 are also indicated in FIG. 4. Note that such an ordered assemblage of micron size particles with several micron size separation may be fabricated with epitaxial or chemical vapor deposition or simple chemical processes (like colloidal chemistry) self-assembly methods. In addition, in FIG. 4, thin-film thermoelectric cooling devices 3 may be incorporated (similar to FIG. 1) to combine high-cooling power density active-cooling with high-flux density radiative heat dissipative processes.

Such spontaneous high radiative heat fluxes near 300K would make the heat-removal problem much more manageable in future electronics cooling. This could obviate the need for liquid heat transfer processes. Thus it should be possible to make an all solid-state, spontaneous-emission-enhanced-refrigeration (SEER) systems with or without thermoelectric cooling devices. The thermoelectric devices would be used where active cooling is needed. Certainly, these SEEHT devices may be necessary for thin-film devices. However, even bulk thermoelectric devices with a heat flux of about 0.5 W/cm² at the heat-sink stge could benefit from these concepts.

Figure 5A:
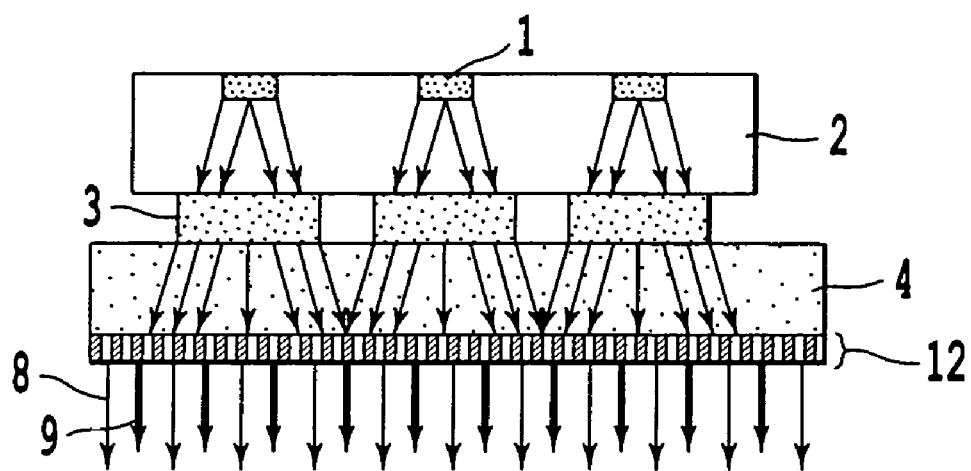
FIGS. 5A and 5B are side and bottom diagrams, respectively, of a structure according to the invention.
Figure 5B:
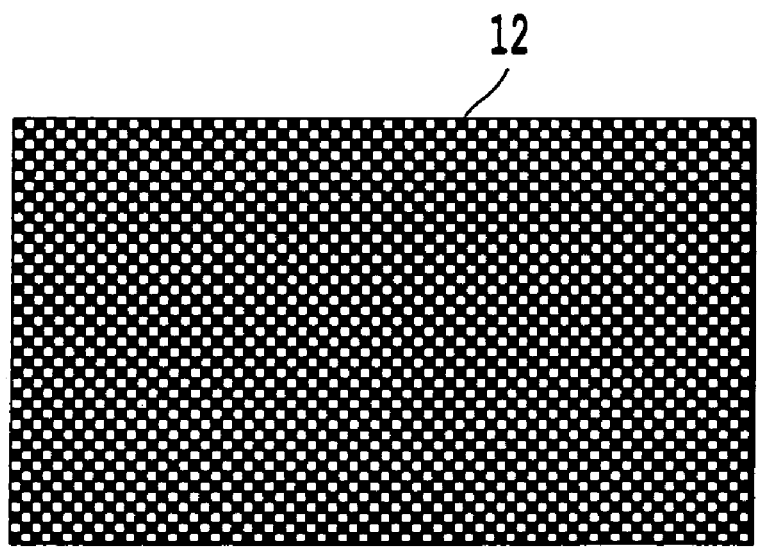

Another possible modification to the structure of FIG. 1A for enhancement of spontaneous emission as applied to enhanced heat removal could be to pattern micron-sized (1 to 20 μm) structures 12 on the heat spreader 4, as shown in FIGS. 5A and 5B. No defect cavity is included. The structures double for micro-fins and thus also enhance spontaneous convective heat loss. For example, an approximately 2 μm structure could be patterned on the heat spreader 4 using standard photolithographic techniques. These 2 μm geometries should be easily achievable with today's lithography in large-area geometries for a cost-effective implementation. Note again the distinction between the regular heat dissipation and the additional spontaneous emission enhanced light waves is indicated in FIG. 5A. Size and pattern differneces for these structures are anticipated based on an f≅λ³/a³—like enhancement factor.

Figure 6:
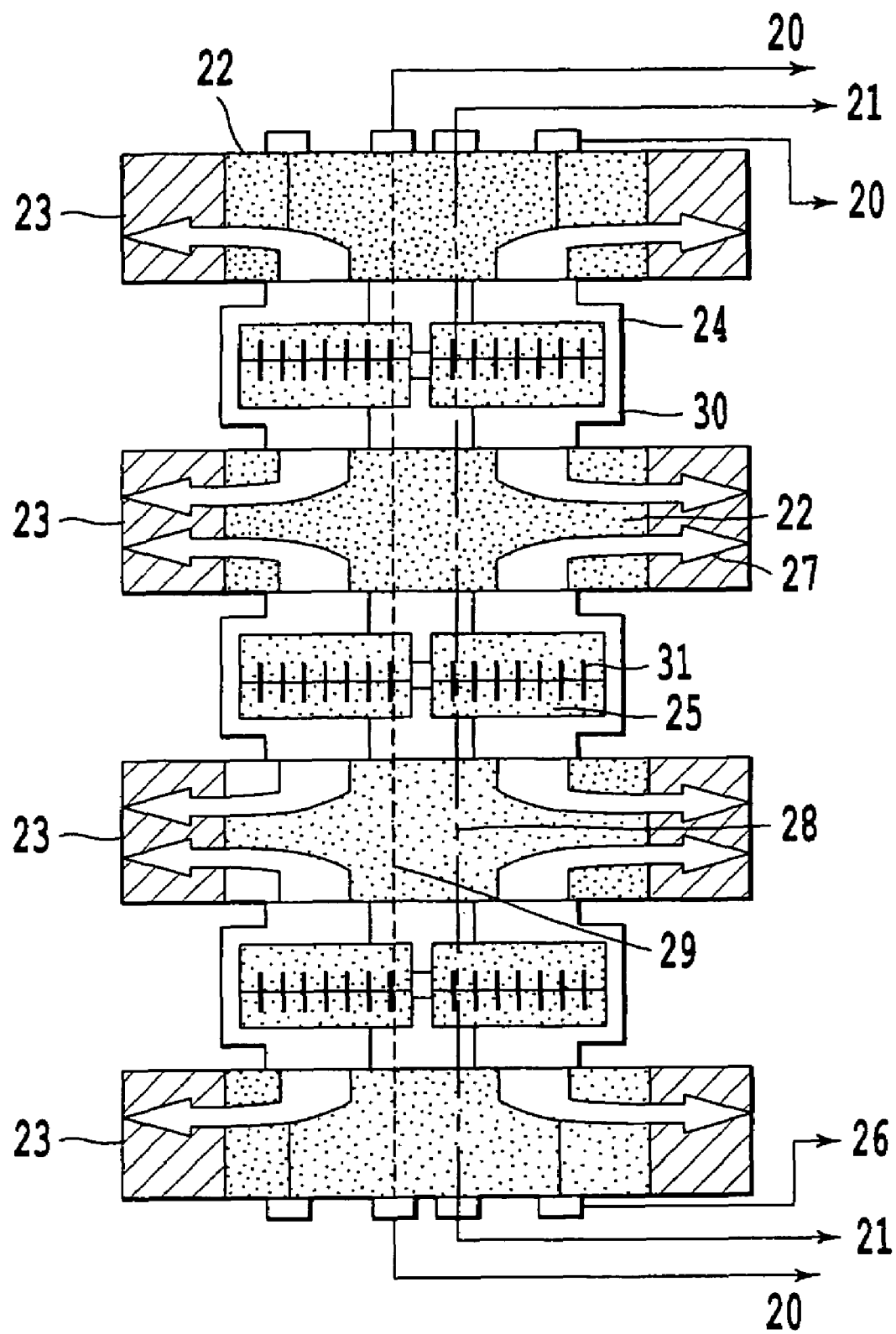
FIG. 6 is a diagram of a multi-chip module according to the invention.

As noted earlier, with the use of spontaneous emission enhanced heat transport structures (SEEHT) it is possible to implement effective cooling strategies (with or without thermoelectrics) in an all solid-state system. Such an advantage is illustrated for a multi-chip module in FIG. 6. Note that this schematic (showing integration in a vertical direction) can be scaled in the lateral dimension as well to produce a 3-dimensional multi-chip module (MCM). Such a 3-D MCM could have thermoelectric devices for cooling at various chip levels and the heat could be radiated from the periphery (both outer-ring, and inner-ring) using SEEHT structures.

Module power lines 20 and module signal line 21 are shown on spreader 22. Formed on both sides of spreader 22 are PBS structures 23. In this example the structures are the conductive material impregnated-type PBS structure, but it is understood that the other PBS described above may also be used. Thermoelectric cooling devices 24 remove heat 27 from electronics chip or device 25. Power is supplied to the TE devices 24 at 26. Inter-level signal paths 28 and inter-level power paths 29 are also shown, as well as inter-level TE power connection 30 and uni-level or intra-level connection 31. Any number of arrangements are possible.

Figure 7:
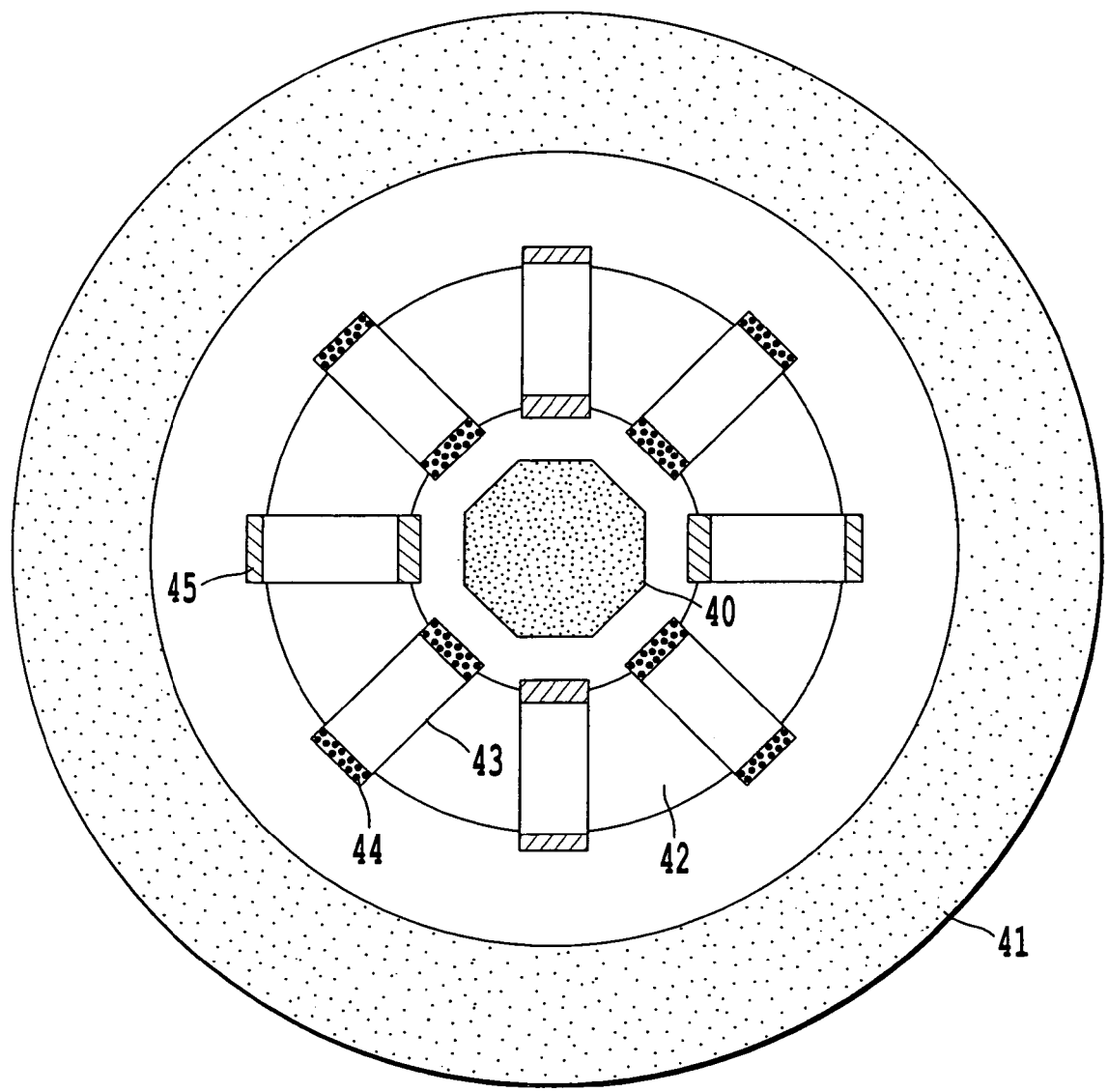
FIG. 7 is a diagram of a three-dimensional multi-chip module according to the invention.

A schematic diagram of such a 3-dimensional spontaneous emission enhanced heat transport multi-chip modules (3-D SEEHT-MCM) is shown in FIG. 7. Liquid-cooled heat-absorbing blackbody cores 40 and 41 can be incorporated inside the ring and outside the ring for absorbing the radiant heat emanating from the SEEHT structures 43 in the periphery. SEEHT structures 43 have heat spreaders with thermoelectric devices 44. Shown at 45 are SEEHT structures with conductive-particle impregnated PBS structures. Although the SEEHT devices are shown alternating as 44 and 45, other arrangements are possible. The cores are kept cooled to increase the temperature differential between them and the SEEHT structures, thereby enhancing radiative heat absorption. The cores could be appropriately coated with high-emissivity (therefore absorptivity) materials to facilitate this process. Note that the "liquid" cooling is confined to areas where active electronics is absent. Thus, the system complexity in these situations ran be considerably reduced.

The present invention offers a new approach to efficient heat spreaders termed SEEHT using enhancement of spontaneous radiant emission of heat at long IR-wavelengths. Under certain situations these SEEHT structures could also benefit from periodic PBS, invoking Bragg scattering thereby preventing emission trapping, specifically tailored for the long IR-wavelengths. The periodic structures around the defect cavity in FIGS. 1A-1D and 2A-2C serve this purpose and could be implemented suitably in the SEEHT exiting surfaces of FIG. 1. Note that the dimensions of such PBS for the long-wavelengths are in the range of 2 µm, considerably larger (and so easily implementable with low-cost lithography) than the sub-micron features needed for the application of PBS to LED's at the visible and near-IR wavelengths.

Two other modifications are also possible in light of the above teachings. One involves the use of similar concepts to obtain what can be described as spontaneous-absorption enhanced sensors (SAES). This stems from the general idea that good absorbers are good dissipaters. The above described concepts to enhance energy flux radiating from a blackbody at temperature (T) are also applicable to energy flux that can be radiatively absorbed by a blackbody at a temperature (T). This can help in designing improved infra-red sensors to detect temperatures of objects. In this case the PBS structures described above are applied to the surface of the blackbody or sensor to enhance the absorbed radiation. Defect cavities may be used, but are not necessary if structures like FIG. 4 are used for enhanced absorption.

Figure 8:
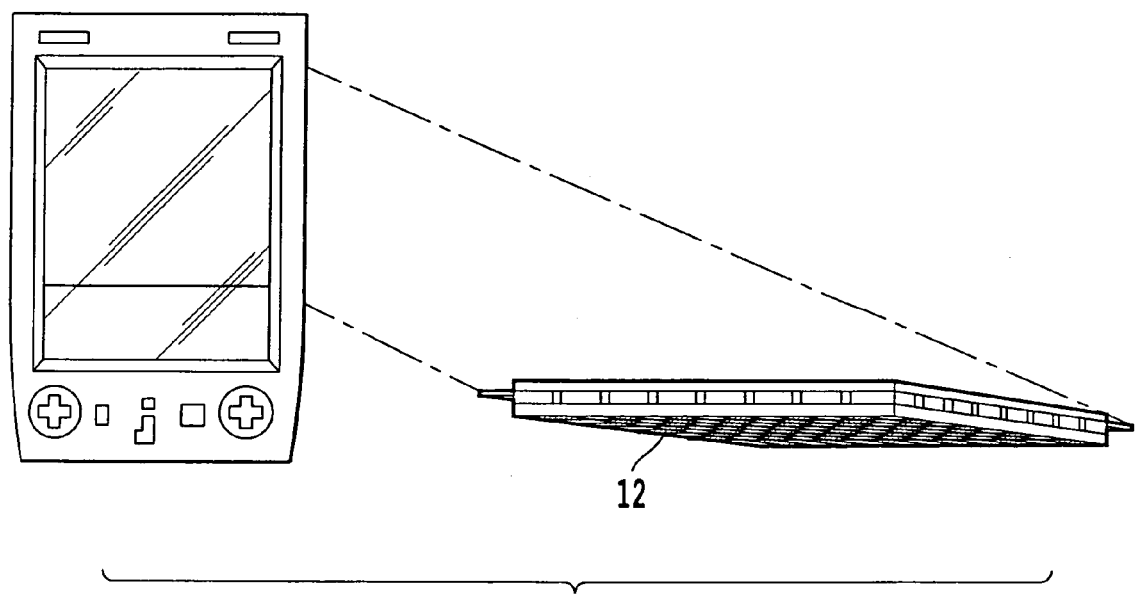
FIG. 8 is a diagram of a hand-held device using a heat transport device according to the invention.

Another involves the use of similar concepts to obtain what can be described as spontaneous-absoption enhanced thermal-to-electrical converters (SAETEC). The above described concepts to enhance energy flux radiating from a blackbody at temperature (T) are also applicable to energy flux that can be radiatively absorbed by a blackbody at a temperature (T). This can help in designing improved thermal-to-electrical power sources. For example, in hand-held devices as shown in the FIG. 8, a SAETEC device can better absorb the heat radiated by the hand which in turn can be converted into electricity by devices such as thermoelectric power converters. The heat from a hand is in the range of 10-15 W. Also, a spontaneous emission enhanced heat transport (SEEHT) device can be worn on the hand thus efficiently radiating the heat from the palm of the hand. Thus a combination of the SEEHT device and SETEC device can be used to maximize the power fed to the hand-held device, augmenting its battery back-up or replacing its battery or reducing the need for its recharging of its batteries more often.

The SETEC can also double as a detector, or incorporate a detector, so that when a user picks up the hand-held device, the heat from the hand is detected and actives the hand-held device.

Numerous other modifications and variations of the present invention are possible in light of the above teachings. It is therefore to be understood that within the scope of the appended claims, the present invention may be practiced otherwise than as specifically described herein. For example, the PBS and SEEHT structures may be attached to or formed in devices or structures other than the semiconductor-type devices described above. The principles of the invention are applicable to a wide range of cooling applications, devices needing cooling such as biological devices, mechanical devices (producing heat within themselves), power generation devices (producing heat in various parts), piezoelectric devices, magnetic devices, optical devices, ceramic devices and plastic devices.

What is claimed as new and desired to be secured by Letters Patents of the United States is:

1. A structure, comprising:
   a substrate including a heat source;
   a heat transfer device disposed on the substrate having a region arranged to receive heat from the heat source;
   a photonic bandgap device joined to said heat transfer device and comprising a bandgap device material different than a susbtrate material of the substrate; and
   the region, the heat transfer device, and the photonic band gap device disposed in an arrangement that directs heat from the heat source through the heat transfer device to the photonic band gap device by which infrared wavelength radiation from the heat transfer device is enhanced over infrared wavelength radiation from the heat transfer device in absence of the photonic bandgap device.

2. The structure as recited in claim 1,
   wherein the photonic bandgap device comprises a plurality of radiative elements having respective upper surfaces opposite the heat transfer device and side surfaces extending from a surface of the heat transfer device, the upper and side surfaces configured to radiate infrared wavelength radiation from the photonic bandgap device.

3. The structure as recited in claim 1, further comprising:
   a thermoelectric device between the heat source and the region of said heat transfer device.

4. The structure as recited in claim 1, wherein said photonic bandgap device comprises:
   an array of columnar structures, said columnar structures enhancing the infrared wavelength radiation and convective heat transfer from the photonic bandgap device.

5. The structure as recited in claim 4, comprising:
   said columnar structures having a diameter in the range of about 1.7-8.6 microns.

6. The structure as recited in claim 5, comprising:
   said columnar structures having a diameter of about 2.25 microns and spacing of about 5 microns.

7. The structure as recited in claim 1, wherein said photonic bandgap device comprises:
   a plurality of conductive particles disposed in the bandgap device material.

8. The structure as recited in claim 7, wherein:
   said bandgap device material comprises a high thermal conductivity material; and
   said particles comprise one of metal, semimetal and semiconductor particles disposed in said material.

9. The structure as recited in claim 7, comprising:
   said particles having infrared transmission properties different than infrared transmission properties of said material.

10. The structure as recited in claim 7, comprising:
    said particles being separated from each other by about one half to three times a wavelength of an infrared emission peak corresponding to the respective temperature of said structure.

11. The structure as recited in claim 7, comprising:
    said particles having a size of about 1 micron and separated from each other by a distance between about 5 and 30 microns.

12. The structure as recited in claim 1, wherein said photonic bandgap device comprises:
    microfins enhancing both radiative and emissive heat transport.

13. The structure as recited in claim 1, further comprising an active area disposed in said substrate and comprising the heat source.

14. The structure as recited in claim 13, comprising:
a thermoelectric device disposed between said substrate and said heat transfer device.

15. The structure as recited in claim 13, comprising:
a plurality of active areas disposed in said substrate.

16. The structure as recited in claim 13, wherein:
said heat transfer device comprises a first portion of said substrate;
said photonic bandgap device comprises a second portion of said substrate; and
said first portion is disposed between said active area and said second portion.

17. The structure as recited in claim 13, wherein said photonic bandgap device comprises:
an array of columnar structures, said columnar structures enhancing the infrared wavelength radiation and convective heat transfer from the photonic bandgap device.

18. The structure as recited in claim 17, comprising:
said columnar structures having a diameter in the range of about 1.7-8.6 microns.

19. The structure as recited in claim 18, comprising:
said columnar structures having a diameter of about 2.25 microns and spacing of about 5 microns.

20. The structure as recited in claim 17, wherein said photonic bandgap device comprises:
a plurality of conductive particles disposed in the bandgap device material.

21. The structure as recited in claim 20, wherein:
said bandgap device material comprises a high thermal conductivity material; and
said particles comprise one of metal, semimetal and semiconductor particles disposed in said material.

22. The structure as recited in claim 20, comprising:
said particles having infrared transmission properties different than infrared transmission properties of said material.

23. The structure as recited in claim 20, comprising:
said particles being separated from each other by about one half to three times a wavelength of an infrared emission peak corresponding to the respective temperature of said structure.

24. The structure as recited in claim 20, comprising:
said particles having a size of about 1 micron and separated from each other by a distance between about 5 and 30 microns.

25. The structure as recited in claim 13, wherein said photonic bandgap device comprises:
microfins enhancing both radiative and emissive heat transport.

26. The structure as recited in claim 1, further comprising:
a heat-to-electric conversion device coupled to said heat transfer device,
wherein the photonic bandgap device is disposed to enhance coupling of heat to said heat transfer device.

27. The structure as recited in claim 26, wherein said photonic bandgap device comprises:
microfins enhancing both radiative and emissive heat transport.

28. The structure as recited in claim 26, wherein said photonic bandgap device comprises:
a plurality of conductive particles disposed in the bandgap device material.

29. The structure as recited in claim 28, wherein:
said bandgap device material comprises a high thermal conductivity material; and
said particles comprise one of metal, semimetal and semiconductor particles disposed in said material.

30. The structure as recited in claim 28, comprising:
said particles having infrared transmission properties different than infrared transmission properties of said material.

31. The structure as recited in claim 28, comprising:
said particles having a size of about 1 micron and separated from each other by a distance between about 5 and 30 microns.

32. The structure as recited in claim 26, comprising one of a hand-held computational and communication devices receiving converted power from said heat-to-electric conversion device.

33. The structure as recited in claim 1, wherein the photonic bandgap device comprises a first photonic bandgap structure and a second photonic bandgap structure, and further comprising:
a thermal-electric conversion device including,
a heat-to-electric conversion device coupled to said heat transfer device, and
the first photonic bandgap structure disposed to enhance coupling of heat to said heat transfer device; and
a heat enhancing emission structure disposed to enhance emission of heat to said heat transfer device and comprising the second photonic bandgap structure.

34. The structure as recited in claim 33, wherein at least one of said first and second photonic bandgap structures comprises:
a plurality of columnar structures formed in an array, said columnar structures enhancing the infrared wavelength radiation and convective heat transfer from the photonic bandgap device.

35. The structure as recited in claim 34, wherein said at least one of said first and second photonic bandgap structures comprises:
a defect cavity disposed in said plurality of columnar structures.

36. The structure as recited in claim 33, wherein at least one of said first and second photonic bandgap structures comprises:
a plurality of conductive particles disposed in the bandgap device material.

37. The structure as recited in claim 36, wherein:
said bandgap device material comprises a high thermal conductivity material; and
said particles comprise one of metal, semimetal and semiconductor particles disposed in said material.

38. The structure as recited in claim 36, comprising:
said particles having infrared transmission properties different than infrared transmission properties of said material.

39. The structure as recited in claim 36, comprising:
said particles having a size of about 1 micron and separated from each other by a distance between about 5 and 30 microns.

40. The structure as recited in claim 33, comprising:
a waste heat source; and
said heat transfer device absorbing heat from said waste heat source.

41. The structure as recited in claim 33, comprising:
said thermal-electric conversion device supplying converted power to a hand-held electronic device.

42. The structure as recited in claim 41, wherein said hand-held electronic device comprises one of a computational or communication device.

43. The structure of claim 1, further comprising a defect cavity formed in said photonic bandgap device.

44. The structure of claim 43, wherein:
said region in said heat transfer device is arranged to receive heat from the heat source; and
said defect cavity is positioned adjacent to said region.

45. The structure of claim 43, further comprising:
a thermoelectric device connected to said heat transfer device.

46. The structure as recited in claim 43, wherein said photonic bandgap device comprises:
an array of columnar structures formed around said cavity, said columnar structures enhancing the infrared wavelength radiation and convective heat transfer from the photonic bandgap device.

47. The structure as recited in claim 46, comprising:
said columnar structures having a diameter in the range of about 1.7-8.6 microns.

48. The structure as recited in claim 47, comprising:
said columnar structures having a diameter of about 2.25 microns and spacing of about 5 microns.

49. The structure as recited in claim 43, wherein said photonic bandgap device comprises:
a plurality of conductive particles disposed in the bandgap device material.

50. The structure as recited in claim 49, wherein:
said bandgap device material comprises a high thermal conductivity material; and
said particles comprise one of metal, semimetal and semiconductor particles disposed in said material.

51. The structure as recited in claim 49, comprising:
said particles having infrared transmission properties different than infrared transmission properties of said material.

52. The structure as recited in claim 49, comprising:
said particles being separated from each other by about one half to three times a wavelength of an infrared emission peak corresponding to the respective temperature of said structure.

53. The structure as recited in claim 49, comprising:
said particles having a size of about 1 micron and separated from each other by a distance between about 5 and 30 microns.

54. The structure as recited in claim 43, wherein said photonic bandgap device comprises:
microfins enhancing both radiative and emissive heat transport.

55. The structure as recited in claim 43, further comprising:
an active area disposed in said substrate and comprising the heat source.

56. The structure as recited in claim 55, comprising:
a thermoelectric device disposed between said substrate and said heat transfer device.

57. The structure as recited in claim 55, wherein:
said heat transfer device comprises a first portion of said substrate;
said photonic bandgap device comprises a second portion of said substrate; and
said first portion is disposed between said active area and said second portion.

58. The structure as recited in claim 55, wherein said photonic bandgap device comprises:
an array of columnar structures formed around said defect cavity, said columnar structures additionally enhancing convective heat transfer from the photonic bandgap device.

59. The structure as recited in claim 58, comprising:
said columnar structures having a diameter in the range of about 1.7-8.6 microns.

60. The structure as recited in claim 59, comprising:
said columnar structures having a diameter of about 2.25 microns and spacing of about 5 microns.

61. The structure as recited in claim 58, wherein said photonic bandgap device comprises:
a plurality of conductive particles disposed in the bandgap device material.

62. The structure as recited in claim 61, wherein:
said bandgap device material comprises a high thermal conductivity material; and
said particles comprise one of metal, semimetal and semiconductor particles disposed in said material.

63. The structure as recited in claim 61, comprising:
said particles having infrared transmission properties different than infrared transmission properties of said material.

64. The structure as recited in claim 61, comprising:
said particles being separated from each other by about one half to three times a wavelength of an infrared emission peak corresponding to the respective temperature of said structure.

65. The structure as recited in claim 61, comprising:
said particles having a size of about 1 micron and separated from each other by a distance between about 5 and 30 microns.

66. The structure as recited in claim 55, wherein said photonic bandgap device comprises:
microfins enhancing both radiative and emissive heat transport.

67. The structure as recited in claim 43, further comprising:
a heat-to-electric conversion device coupled to said heat transfer device,
wherein the photonic bandgap device is disposed to enhance coupling of heat to said heat transfer device.

68. The structure as recited in claim 67, wherein said photonic bandgap device comprises:
a plurality of columnar structures formed in an array, said columnar structures enhancing the infrared wavelength radiation and convective heat transfer from the photonic bandgap device.

69. The structure as recited in claim 68, wherein said defect cavity is disposed in said plurality of columnar structures.

70. The structure as recited in claim 67, wherein said photonic bandgap device comprises:
a plurality of conductive particles disposed in the bandgap material.

71. The structure as recited in claim 70, wherein:
said bandgap device material comprises a high thermal conductivity material; and
said particles comprise one of metal, semimetal and semiconductor particles disposed in said material.

72. The structure as recited in claim 70, comprising:
said particles having infrared transmission properties different than infrared transmission properties of said material.

73. The structure as recited in claim 70, comprising:
said particles having a size of about 1 micron and separated from each other by a distance between about 5 and 30 microns.

74. The structure as recited in claim 67, comprising one of a hand-held computational and communication devices receiving converted power from said heat-to-electric conversion device.

75. The structure as recited in claim 43, wherein the photonic bandgap device comprises a first photonic bandgap structure and a second photonic bandgap structure, and further comprising:
a thermal-electric conversion device including,
a heat-to-electric conversion device coupled to said heat transfer device, and
the first photonic bandgap structure disposed to enhance coupling of heat to said heat transfer device; and
a heat enhancing emission structure disposed to enhance emission of heat to said heat transfer device and comprising the second photonic bandgap structure.

76. The structure as recited in claim 75, wherein at least one of said first and second photonic bandgap structures comprises:
a plurality of columnar structures formed in an array, said columnar structures enhancing the infrared wavelength radiation and convective heat transfer from the photonic bandgap device.

77. The structure as recited in claim 76, wherein the defect cavity is disposed in said plurality of columnar structures.

78. The structure as recited in claim 75, wherein at least one of said first and second photonic bandgap structures comprises:
a plurality of conductive particles disposed in the bandgap material.

79. The structure as recited in claim 78, wherein:
said bandgap device material comprises a high thermal conductivity material; and
said particles comprise one of metal, semimetal and semiconductor particles disposed in said material.

80. The structure as recited in claim 78, comprising:
said particles having infrared transmission properties different than infrared transmission properties of said material.

81. The structure as recited in claim 78, comprising:
said particles having a size of about 1 micron and separated from each other by a distance between about 5 and 30 microns.

82. The structure as recited in claim 74, comprising:
a waste heat source; and
said heat transfer device absorbing heat from said waste heat source.

83. The structure as recited in claim 74, comprising:
said thermal-electric conversion device supplying converted power to a hand-held electronic device.

84. The structure as recited in claim 83, wherein said hand-held electronic device comprises one of a computational or communication device.

85. A structure, comprising:
a solid state electronic device;
a substrate supporting the solid state electronic device and providing a heat transfer mechanism to conduct heat from the solid state device;
a photonic bandgap device joined to said substrate and including a structured-material having a plurality of radiative elements spaced apart by which infrared wavelength radiation from the substrate is enhanced over infrared wavelength radiation from the substrate in absence of the photonic bandgap device; and
said solid state electronic device, substrate, and photonic bandgap device disposed in an arrangement that directs heat from the solid state device through the substrate to the photonic bandgap device,
wherein the structured material comprises a material different than a material of the substrate.

86. The structure as recited in claim 85, further comprising:
a multichip module including the solid state device, the substrate, and other circuitry; and
said photonic bandgap device is configured to enhance radiation of heat from the multichip module.

87. The structure as recited in claim 85, further comprising:
a heat-to-electric conversion device coupled to said substrate.

88. The structure as recited in claim 87, wherein the heat-to-electric conversion device comprises a thermoelectric element.

89. A structure, comprising:
a heat transfer device having a region arranged to receive heat from a heat source;
a photonic bandgap device joined to said heat transfer device;
a thermoelectric device between the heat source and the region of said heat transfer device; and
the region, the heat transfer device, the thermoelectric device, and the photonic band gap device disposed in an arrangement that directs heat from the heat source through the heat transfer device through the thermoelectric device to the photonic band gap device by which infrared wavelength radiation from the heat transfer device is enhanced over infrared wavelength radiation from the heat transfer device in absence of the photonic bandgap device.

90. A structure, comprising:
a heat transfer device having a region arranged to receive heat from a heat source;
a photonic bandgap device joined to said heat transfer device;
a heat-to-electric conversion device coupled to said photonic bandgap device; and
the region, the heat transfer device, the photonic band gap device, and the heat-to-electric conversion device disposed in an arrangement that directs heat from the heat source through the heat transfer device through the photonic band gap device to the heat-to-electric conversion device by which infrared wavelength radiation from the heat transfer device is enhanced over infrared wavelength radiation from the heat transfer device in absence of the photonic bandgap device.

* * * * *